United States Patent [19]

Mehra

[11] Patent Number: 5,360,697
[45] Date of Patent: Nov. 1, 1994

[54] FORMING SELF-ALIGNED DIFFUSION BARRIERS IN SOLID STATE DEVICES USING LIFT-OFF PROCESS

[75] Inventor: Madhav Mehra, Rochester, N.Y.

[73] Assignee: Eastman Kodak Company, Rochester, N.Y.

[21] Appl. No.: 75,659

[22] Filed: Jun. 11, 1993

Related U.S. Application Data

[63] Continuation-in-part of Ser. No. 842,681, Feb. 27, 1992, abandoned.

[51] Int. Cl.$^5$ ............................................... G03C 5/00
[52] U.S. Cl. ...................................... 430/314; 430/313; 430/317; 430/329; 156/643; 156/659.1; 156/661.1
[58] Field of Search ............... 430/313, 314, 317, 329; 156/643, 651, 659.1, 661.1

[56] References Cited

U.S. PATENT DOCUMENTS 5,017,459  5/1991  McColgin .......................... 430/299
5,057,186  10/1991  Chew .................................. 430/317

OTHER PUBLICATIONS

J. M. Frary et al., "Lift–Off Techniques for Fine Line Metal Patterning", *Semiconductor International*, pp. 72–82, Dec. 1981.

Primary Examiner—Marion E. McCamish
Assistant Examiner—Kathleen Duda
Attorney, Agent, or Firm—Raymond L. Owens

[57] ABSTRACT

A conductive self-aligned diffusion barrier is formed by using a self-aligned lift-off process.

3 Claims, 1 Drawing Sheet

FORMING SELF-ALIGNED DIFFUSION BARRIERS IN SOLID STATE DEVICES USING LIFT-OFF PROCESS

CROSS-REFERENCE TO RELATED APPLICATION

This application is a continuation-in-part of commonly assigned U.S. patent application No. 07/842,681 filed Feb. 27, 1992, now abandoned, entitled "Forming Self-Aligned Diffusion Barriers in Solid State Devices Using Lift-off Process" to Madhav Mehra.

FIELD OF THE INVENTION

The present invention relates to a method of forming self-aligned diffusion barriers in solid state devices.

BACKGROUND OF THE INVENTION

In solid-state devices, using silicon or gallium-arsenide substrates, there is considerable need for diffusion barriers between the interconnect material and the silicon substrate. These diffusion barriers are required to prevent egregious contact between the interconnect material and the silicon substrate. A typical prior art arrangement is shown in FIG. 1. On a silicon substrate 10 there is provided a dielectric layer 12. An opening is etched in the dielectric layer and a diffusion barrier 14 is provided in the opening of the dielectric layer between an aluminum contact layer 16 and the silicon substrate 10. The reason for the diffusion barrier is to prevent interaction between the aluminum film and the underlying silicon upon heat treatment. This interaction usually results in dissolution and redeposition of silicon from the silicon substrate 10, which increases contact resistance, and in "spiking" of aluminum which results in excess leakage currents across any junctions that may be present below the contact opening. The diffusion barrier is typically a thin film (500–3000Å) of a material that inhibits this reaction, such as titanium nitride (TiN), titanium tungsten (TiW) or tungsten (W).

In order to form the structure of FIG. 1 the diffusion barrier (which is metallic, and hence conducting) has to be etched contiguously with the overlying metallization layer, in our case aluminum. This is often a concern when either the etching chemistries are not known or when the propensity for corrosion is enhanced, such as for aluminum lines over TiW diffusion barriers. Further, in certain special cases, such as infrared devices, the underside of the aluminum films act as an IR reflector. Having a contiguous diffusion barrier such as TiW lowers the IR reflectivity of the Al film.

In addition to the special IR reflectivity problem mentioned above, the problem with this prior art arrangement is that more desirable barrier materials such as amorphous alloys cannot be used because they are not easily plasma etched. The use of wet etching is not commensurate with the requirements of VLSI technology. Furthermore, the advent of corrosion, as cited above, is more significant when upon the completion of the aluminum etch a continuous metallic film (the diffusion barrier) remains underneath and can enhance the galvanic action required for corrosion. For these reasons, it is desirable to have the diffusion barrier patterned prior to the deposition of the aluminum interconnect material.

SUMMARY OF THE INVENTION

It is an object of the present invention to provide a process for forming conductive diffusion barriers which eliminate the etchability problem discussed above. Furthermore, the diffusion barriers are self-aligned with the underlying contact holes without the requirement of any additional masking steps.

In our specific materials system of a silicon substrate and aluminum interconnects, this object is achieved in a method of forming self-aligned diffusion barriers in solid state devices comprising the steps of:

(a) forming a dielectric layer on a silicon substrate;

(b) forming an intermediate assisting coating on the dielectric layer;

(c) forming a photoresist layer on the coating;

(d) exposing the photoresist layer with a desired pattern developing an opening through the exposed pattern in the photoresist with a developer which attacks the intermediate assisting coating so that it undercuts the photoresist layer;

(e) plasma etching the dielectric layer through the opening in the photoresist layer and intermediate assisting coating to form a contact opening in the dielectric layer to the silicon substrate;

(f) depositing conductive diffusion barrier material in the opening in the dielectric layer and on the photoresist layer;

(g) lifting off the photoresist layer and the diffusion barrier material on the photoresist layer by a solvent which dissolves the intermediate assisting coating resulting in the formation of a diffusion barrier layer self-aligned to the opening formed in step (e) so that step (d) is used for both defining the contact opening as well as locating the diffusion barrier; and (h) forming an aluminum contact layer on the diffusion barrier in the opening in the dielectric layer.

An advantage of this invention is the wide range of materials that can be used for a diffusion barrier bypassing the requirements of etchability found in the prior art.

Another advantage of this invention is that the diffusion barrier is capable of being deposited by sputtering, evaporation or low temperature chemical deposition by reacting appropriate gases (CVD), without requiring complex masking or patterning steps.

A third advantage is that this diffusion barrier is self-aligned to the contact hole; this increases the alignment tolerance of the subsequent interconnect to the contact.

BRIEF DESCRIPTION OF THE DRAWINGS

The invention will be better understood from the more detailed description taken with the accompanying drawings.

It should be appreciated that for purposes of exposition, the drawings are not to scale since the various dimensions, particularly in the vertical direction, are quite small.

DESCRIPTION OF THE PREFERRED EMBODIMENTS

Figure 1:
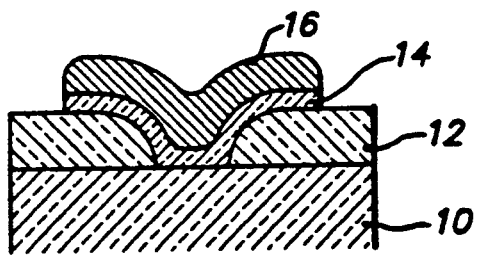
FIG. 1 shows a prior art arrangement.

With reference to FIG. 2a–f, where parts correspond to those of FIG. 1, the same reference numerals will be used. As shown in FIG. 1, a silicon substrate 10 has a dielectric layer 12 formed on it. The dielectric layer is usually silicon dioxide (SiO₂) and may either be thermally grown on the silicon substrate or deposited conformally using a CVD technique. It is also possible to use variations of silicon dioxide as oxy-nitride for this dielectric.

Figure 2A:
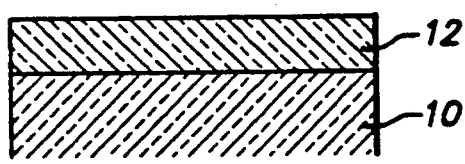
FIGS. 2a–f list the basic sequence of steps in an illustrative process in accordance with the invention.
Figure 2B:
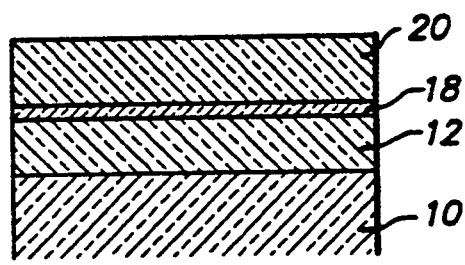
Figure 2C:
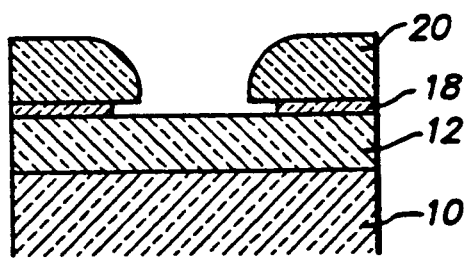

As shown in FIG. 2b, an intermediate assisting coating 18 is formed on the dielectric layer and a positive photoresist layer 20 is formed on the intermediate assisting coating 18. Preferably the photoresist layer has a thickness of 1 to 1.5 μm. The present invention makes use of a lift-off process, and so it is important that the material forming the intermediate assisting coating 18 be capable of being undercut, as shown in FIG. 2c. Towards this end, it must also be dissolved during the lift-off process. For forming such a layer, an intermediate assisting coating (layer) 18, advantageously of between 1600–2000Å thickness of Brewer Science ARC PN-2, is spun-on, typically at 5000 revolutions per minute, over a top surface of the dielectric layer 12.

Then the spun-on coating is partially imidized by baking on a standard hot plate-chill plate (not shown) at about 163° C. for about 93 seconds, for use as the assisting layer of a lift-off mask to be formed.

ARC PN-2 is generically a polyamic acid with an absorbing or anti-halation due to limiting undesired light scattering or reflection during the lithographic exposure of the overlying photoresist layer. The polyamic acid is quite soluble in the photoresist developer and in practice is partially imidized on the silicon substrate by baking. Fully imidized PN-2 is not soluble so it is important for anti-reflection purposes to bake (imidize) it just enough to let it develop at a similar rate to that of the exposed photoresist. Underbaked excessively, it will dissolve out from under the overlying photoresist and wash away or distort the desired pattern. Underbaked slightly, it will result in the undercutting desirable for this invention. Overbaked, it will be difficult to remove and tend to leave a scum. The proper baking is best determined by trial and error for a particular set of conditions.

Then the spun-on intermediate assisting coating is partially imidized by baking on a standard hot plate-chill plate (not shown) at about 163° C. for about 93 seconds, for use as the intermediate assisting intermediate assisting coating 18 of a lift-off mask to be formed.

Next, the intermediate assisting intermediate assisting coating 18 is coated with a positive photoresist layer 20, such as KTI 820 which is a positive photoresist, to provide a resulting total thickness of about 1.2 microns, although photoresist layers as thin as about 4000Å are feasible.

For example, if the photoresist layer 20 is KTI 820 then the photoresist layer 20 is prebaked at about 125° C. for 19 seconds in close proximity to a hotplate (not shown) and then for 30 seconds in contact with the hotplate. This completes formation of a composite mask layer comprising intermediate assisting coating 18 and photoresist layer 20.

Then in conventional fashion this photoresist layer 20 is exposed to the desired pattern, by irradiation with light of a suitable wavelength, e.g., 4360Å, through an optical mask (not shown) with the desired pattern, typically for about 100 milliseconds, in a commercial stepper such as a ASET SLR 800 stepper.

Next, the intermediate assisting coating 18 and the photoresist layer 20 are developed or etched together in a single step. For a specific example, this can be accomplished with a KTO 934 developer which is a positive photoresist (1:1 concentration) by immersion with no agitation for about 110 seconds. By such immersion, the exposed portions of the photoresist layer 20 are first etched directionally anisotropically, but, after the assisting intermediate assisting coating 18 is reached, the etching proceeds isotropically to cause undercutting of the intermediate assisting coating 18. If the immersion is discontinued when the underlying top surface of the dielectric layer 12 is reached, there is formed an opening in which the undercutting of the intermediate assisting coating 18 has an aspect ratio of about one, corresponding to a lateral undercut about equal to the original thickness of the assisting intermediate assisting coating 18.

It can be readily appreciated from reviewing FIG. 2c that excessive undercutting would leave inadequate support for the photoresist layer 20. A typical result after sectioning is shown in FIG. 2c. The silicon substrate 10 supports a dielectric layer 12. On the top of this layer is a composite mask formed of the intermediate assisting layer 18 and the photoresist layer 20. Preferably, the lateral width of the undercut in the intermediate assisting coating 18 is approximately 2000Å on each side, about the same as the thickness of the intermediate assisting coating 18. In other examples with lower ARC PN-2 bake temperatures, for example 158° C., undercuts of as much as 8000Å were obtained. For more discussion of a lift-off process (used in a sputtering application) see commonly assigned U.S. Pat. No. 5,017,459 to McColgin, the disclosure of which is incorporated by reference herein.

Figure 2D:
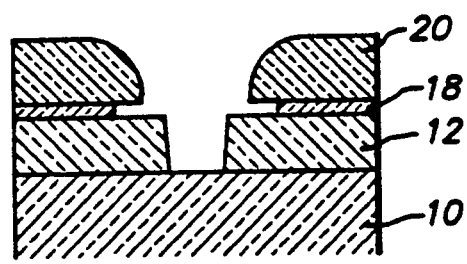

Thereafter, the silicon substrate 10, with the dielectric layer 12, the composite mask comprising of intermediate assisting coating 18 and photoresist layer 20, is placed in a standard plasma etcher (not shown) like the Tegal 903e and etched in a reactive ion etching (RIE) mode. The chemistry used in the etcher was optimized for the dielectric layer 12. The etch is continued until the top surface of the silicon substrate 10 is exposed. Due to the anisotropicity of the RIE, the pattern formed in the dielectric layer 12 conformed to the sidewalls in the photoresist layer 20 and not to those in the assisting intermediate assisting coating 18. This is shown in FIG. 2d.

Figure 2E:
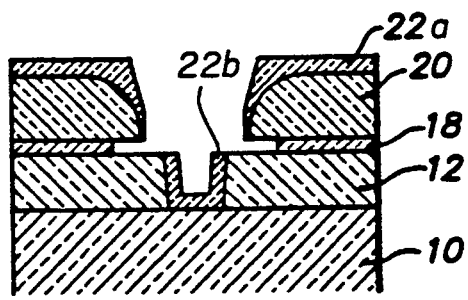

Thereafter, the silicon substrate 10, with the patterned dielectric layer 12 and the composite mask comprising of intermediate assisting coating 18 and photoresist layer 20, was put in a standard sputtering chamber (not shown) and a layer 22 of the diffusion barrier material was deposited. In the instance of our example, the material chosen for this layer 22 was titanium-tungsten (TiW). The result is seen in FIG. 2e and includes a non-contiguous layer 22 of TiW that includes portions 22a covering upper and side portions of the photoresist layer 20 and portions 22b directly covering the etched parts of dielectric layer 12 and making contact with the exposed part of the silicon substrate 10.

Figure 2F:
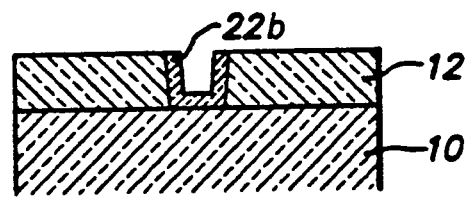
Figure 3:
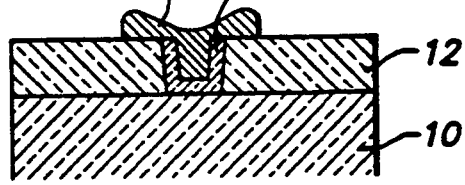
FIG. 3 shows a structure completed in accordance with the present invention.

The silicon substrate 10 was then treated in an ultrasonic bath (not shown) containing N-methyl pyrolidinone to remove the composite mask comprising of photoresist layer 20 and intermediate assisting coating 18 and portions 22a of layer 22. The result, shown in FIG. 2f, is a silicon substrate 10, with the patterned dielectric layer 12, free both of the photoresist 20 and the assisting intermediate assisting coating 18 and including only the film pattern formed by portions 22b of the deposited layer 22. This results in the formation of a diffusion barrier layer 22b, self-aligned to the opening in the dielectric layer 12. In a conventional process, the alignment of the diffusion barrier to the contact hole would require two lithographic operations. Such sequential lithographic operations are always subject to certain misalignments. By using the same photolithographic operation to define both the contact opening and locating the diffusion barrier, the potential for any misalignment is completely eliminated. The process is then completed by introducing the silicon substrate 10, with the patterned dielectric layer 12, and the self-aligned portion 22b of the layer 22 in a standard sputtering system and depositing an aluminum contact layer 16. Aluminum contact layer 16 is then patterned in the conventional manner to form interconnects. FIG. 3 shows the completed structure.

It is to be appreciated and understood that the specific embodiment of the invention is merely illustrative of the general principles of the invention. Various modifications may be made consistent with the principles set forth. For example, as previously indicated, the parameters of the baking and development of the ARC PN-2 can be varied. All these variations must still leave the composite mask comprised of photoresist layer 20 and intermediate assisting coating 18 rigid enough to withstand the etching of the dielectric layer 12 without disintegration. Still further, the diffusion barrier of choice may be a material conventional to VLSI processing or an esoteric material such as amorphous alloys. Also, the silicon substrate system need not be restricted to silicon but could include any system where an electrical contact is required without the fear of degradation due to thermal instability. Examples would include III–V and II–VI systems like gallium arsenic and cadmium-telluride.

A feature of this invention is the use of that lift-off scheme to self-align conductive diffusion barriers to contact holes. What makes this possible is the robust nature of the photoresist profile. Unlike traditional lift-off profiles such as described by J. M. Frary and P. Reise in "Lift-Off Techniques for Fine Line Metal Patterning", pp. 72–82, *Semiconductor International*, December, 1981, we used a thick layer (for example, 1 to 1.5 μm) of positive resist on top of a thin layer of the ARC layer (1600–2000Å). This thick positive resist is able to withstand the erosion encountered in the plasma etch process without suffering the consequences of loosing a profile optimum for lift-off.

The invention has been described in detail with particular reference to certain preferred embodiments thereof, but it will be understood that variations and modifications can be effected within the spirit and scope of the invention.

PARTS LIST

10 Silicon Substrate
12 Dielectric Layer
14 Diffusion Layer
16 Aluminum Contact Layer
18 Intermediate Assisting Coating
20 Photoresist Layer
22 Layer
22a portions
22b portions

What is claimed is:

1. In a method of forming self-aligned diffusion barriers in solid state devices comprising the steps of:
    (a) forming a dielectric layer on a silicon substrate;
    (b) forming an intermediate assisting coating on the dielectric layer;
    (c) forming a photoresist layer on the coating;
    (d) in a lithographic process exposing the photoresist layer with a desired pattern and developing an opening through the exposed pattern in the photoresist with a developer which attacks the intermediate assisting coating so that it undercuts the photoresist layer;
    (e) plasma etching the dielectric layer through the opening in the photoresist layer and intermediate assisting coating to form a contact opening in the dielectric layer to the silicon substrate;
    (f) depositing conductive diffusion barrier material in the contact opening in the dielectric layer and on the photoresist layer;
    (g) lifting off the photoresist layer and the diffusion barrier material on the photoresist layer by a solvent which dissolves the intermediate assisting coating resulting in the formation of a diffusion barrier layer self-aligned to the contact opening formed in step (e) so that step (d) is used for both defining the contact opening as well as locating the diffusion barrier; and
    (h) forming an aluminum contact layer on the diffusion barrier in the contact opening in the dielectric layer.

2. The method of claim 1 wherein the photoresist layer has a thickness of 1 to 1.5 μm.

3. The method of claim 2 wherein the intermediate assisting coating has a thickness of 1600–2000Å.

* * * * *